United States Patent
Kumamoto et al.

(10) Patent No.: US 8,809,193 B2
(45) Date of Patent: Aug. 19, 2014

(54) METHOD FOR THE FORMATION OF CO FILM AND METHOD FOR THE FORMATION OF CU INTERCONNECTION FILM

(75) Inventors: Shoichiro Kumamoto, Shizuoka (JP); Satoru Toyoda, Sizuoka (JP); Harunori Ushikawa, Shizuoka (JP)

(73) Assignee: Ulvac, Inc., Kanagawa (JP)

( * ) Notice: Subject to any disclaimer, the term of this patent is extended or adjusted under 35 U.S.C. 154(b) by 209 days.

(21) Appl. No.: 13/393,790

(22) PCT Filed: Sep. 2, 2010

(86) PCT No.: PCT/JP2010/065063
§ 371 (c)(1),
(2), (4) Date: Oct. 4, 2012

(87) PCT Pub. No.: WO2011/027834
PCT Pub. Date: Mar. 10, 2011

(65) Prior Publication Data
US 2013/0023116 A1    Jan. 24, 2013

(30) Foreign Application Priority Data
Sep. 2, 2009  (JP) ................ 2009-202891

(51) Int. Cl.
*H01L 21/44*    (2006.01)
(52) U.S. Cl.
USPC .............. 438/687; 438/660; 257/E21.584
(58) Field of Classification Search
USPC ........................................... 438/641
See application file for complete search history.

(56) References Cited

U.S. PATENT DOCUMENTS

| | | |
|---|---|---|
| 6,294,836 B1 | 9/2001 | Paranjpe et al. |
| 6,365,502 B1 | 4/2002 | Paranjpe et al. |
| 6,812,126 B1 | 11/2004 | Paranjpe et al. |
| 7,557,229 B2 | 7/2009 | Gordon et al. |
| 2002/0102838 A1 | 8/2002 | Paranjpe et al. |
| 2002/0137332 A1 | 9/2002 | Paranjpe et al. |
| 2003/0034558 A1 | 2/2003 | Umemura et al. |
| 2005/0199875 A1 | 9/2005 | Umemura et al. |
| 2006/0141155 A1 | 6/2006 | Gordon et al. |
| 2008/0254232 A1 | 10/2008 | Gordon et al. |
| 2009/0053426 A1 | 2/2009 | Lu et al. |
| 2010/0092667 A1 | 4/2010 | Gordon et al. |

FOREIGN PATENT DOCUMENTS

| | | |
|---|---|---|
| JP | 2003-055769 A | 2/2003 |
| JP | 2003-133377 A | 5/2003 |
| JP | 2005-086185 A | 3/2005 |
| JP | 2006-511716 A | 4/2006 |
| JP | 2006-299407 A | 11/2006 |
| JP | 2009-130288 A | 6/2009 |
| KR | 10-2005-0122629 A | 12/2005 |
| WO | WO 2004/046417 A2 | 6/2004 |
| WO | WO 2009088522 A2 | 7/2009 |

OTHER PUBLICATIONS

Korean Office Action, mail date Apr. 9, 2013.

*Primary Examiner* — Cheung Lee
(74) *Attorney, Agent, or Firm* — Arent Fox, LLP

(57) ABSTRACT

A Co film is formed by supplying cobalt alkylamidinate, and a combined gas containing $H_2$ gas with at least one member selected from the group consisting of $NH_3$, $N_2H_4$, $NH(CH_3)_2$, $N_2H_3CH$, and $N_2$ as a reducing gas, or at least one gas selected from the group consisting of $NH_3$, $N_2H_4$, $NH(CH_3)_2$, $N_2H_3CH$, and $N_2$ as a reducing gas, on the surface of a base material, which consists of an $SiO_2$ film or a barrier film serving as a primary layer. A Cu interconnection film is formed on the surface of the Co film.

35 Claims, 10 Drawing Sheets

(a-1) (b-1)

Non-adhesive interface    Adhesive interface (a-2) (b-2)

Immediately after the Film-Formation    Heat-treated at 350°C for 10 minutes (a-1)

(b-1)

(a-2)

(b-2)

(a-1)  (a-2)  (a-3)  (a-4)

(b-1)  (b-2)  (b-3)  (b-4)

(a)

(b)

(a)　　　　　　　　(b)　　　　　　　　(c)

METHOD FOR THE FORMATION OF CO FILM AND METHOD FOR THE FORMATION OF CU INTERCONNECTION FILM

CROSS-REFERENCE TO RELATED APPLICATION

This Application is a National Stage entry of International Application No. PCT/JP2010/065063 having an international filing date of Sep. 2, 2010; which claims priority to Japanese Application No.: 2009-202891, filed Sep. 2, 2009; the disclosure of each of which is hereby incorporated in its entirety by reference.

TECHNICAL FIELD

The present invention relates to a method for the formation of a Co film and a method for the formation of a Cu interconnection film and more specifically to a method for the formation of a Co film used as an adhesive layer arranged between a primary layer and the Cu interconnection film subsequently applied onto the same in the process for the production of a semiconductor device and a method for the formation of a Cu interconnection film or a Cu distributing wire film, which has a Co film produced according to the foregoing method as such an adhesive layer.

BACKGROUND ART

In the currently-used Cu interconnection film-forming process, a PVD-barrier film (for instance, PVD-Ti film or PVD-Ta film) and PVD-seed film (PVD-Cu film) are formed according to the through production process in vacuo (vacuum-in situ process) and subsequently a Cu-plating process and a CMP process are carried out. However, on or after the generation of the device node of 32 nm, the asymmetry and overhang observed for the wafer edge of a PVD film have become more and more conspicuous because of the recent micronization of the interconnection pattern and for this reason, the currently-used interconnection film-forming process suffers from a problem such that voids are generated in the resulting interconnection film during the plating process.

In this connection, the term "PVD-barrier film" means a barrier film formed according to the PVD technique and the term "PVD-seed film" means a seed film formed according to the PVD technique. The PVD (CVD)-Cu film, the ALD-barrier film and the CVD (ALD)-Co film appearing in the following description mean the respective films formed according to the PVD, CVD and ALD techniques, respectively.

If a PVD-seed film 103 (PVD-Cu film) is formed on a barrier film 102 provided on a substrate 101, which is provided thereon with holes each having a diameter $\phi$ of 32 nm and trenches, as shown in, for instance, FIGS. 1(*a*) and 1(*b*), the following problems would arise: The openings of, for instance, the holes or trenches are narrowed or degraded due to the overhang (the portion indicated by A) observed at the upper portions of the holes or trenches; and when filling up the interior of the holes or the like with a Cu film 104 in the subsequent plating step, a plating solution cannot easily penetrate into the same and the adhesion between the Cu film and a barrier film is insufficient, and this in turn results in the sucking of the Cu film along with the filling up of the same with the Cu film and voids (the portion indicated by B) are thus generated within the resulting Cu film. Moreover, the following problem would likewise arise: As shown in FIGS. 1(*c*) and 1(*d*), any uniform and symmetrical PVD-seed film 103 cannot be formed on the side walls of the holes or the like (see the portion indicated by C), and voids (the portion indicated by D) are generated or formed within the Cu film 104 used for the filling up of the holes or the like during the subsequent plating step, because of the asymmetrical characteristics of this barrier film.

Since the barrier film formed according to the ALD and/or CVD techniques and the CVD-Cu film do not suffer from such problems as the occurrence of any asymmetry and the formation of overhang, it has been attempted to form a Cu interconnection film using these two processes (see, for instance, Patent Document 1 specified below). However, a problem likewise arises, in this case, such that the adhesion of the CVD-Cu film to the ALD-barrier film as a primary film therefor is insufficient and accordingly, voids are also generated within the Cu film. For this reason, this technique has not yet been put into practical use.

For example, as shown in FIGS. 2(*a*) and 2(*b*), if a TiN barrier film 202 is formed within the holes and trenches arranged or formed on a substrate 201 according to the ALD technique (ALD-TiN barrier film) and then the interior of the holes or the like are filled up with a CVD-Cu film 203, voids (the portion indicated by A) are generated in the Cu film thus formed. In this connection, FIG. 2(*a*) is an SEM micrograph illustrating a cross section of the substrate wherein the holes and trenches provided thereon are filled up with the CVD-Cu film 203, while FIG. 2(*b*) is a schematic diagram thereof.

There have been made attempts to use a Co thin film excellent in the coverage properties and having low resistance in order to eliminate the generation of any void in the Cu film due to the insufficiency of the adhesion between the CVD-Cu film and the ALD-barrier film serving as the primary film therefor as has been discussed above and to improve the barrier properties and/or the adhesion and for this reason, it would be an urgent necessity to develop a Co film forming technique while using the CVD or ALD technique. Regarding the Co film, there has also been a growing demand for the development of a Co film having excellent coverage properties in not only the field of the Cu interconnection film, but also the field of the silicide layer and the cap layer.

Contrary to this, in the case of the conventional Co film produced according to the CVD technique while using an organometal material containing Co and an amine (see, for instance, Patent Document 2 specified below), various problems arise such that this technique requires a long Co nucleus-growing time on the order of 20 minutes, the growth rate of Co nuclei is likewise slow on the order of 1 nm/min and the resulting Co film has a high concentration of C as an impurity, which may reach 30%.

PRIOR ART LITERATURE

Patent Literature

Patent Document 1: Japanese Un-Examined Patent Publication No. 2003-055769;
Patent Document 2: Japanese Un-Examined Patent Publication No. 2006-299407.

DISCLOSURE OF THE INVENTION

Problems that the Invention is to Solve

It is an object of the present invention to solve the foregoing problems associated with the conventional techniques and more specifically to provide a method for the formation of a Co film according to, for instance, the CVD technique, while using a specific reducing gas, and a method for the formation of a Cu interconnection film, which is used in the process for the production of a semiconductor device and which makes use of a Co film as an adhesive layer (primary layer), whose adhesiveness to the Cu interconnection film is substantially improved.

Means for the Solution of the Problems

A first invention concerning the method for the formation of a Co film according to the present invention is characterized in that it comprises the step of forming a Co film by supplying cobalt alkylamidinate, and a combined gas containing $H_2$ gas and at least one member selected from the group consisting of $NH_3$, $N_2H_4$, $NH(CH_3)_2$, $N_2H_3CH$, and $N_2$ as a reducing gas, or at least one gas selected from the group consisting of $NH_3$, $N_2H_4$, $NH(CH_3)_2$, $N_2H_3CH$, and $N_2$ as a reducing gas, on the surface of a base material, in which the surface consists of an $SiO_2$ film or a barrier film serving as a primary layer.

As has been described above, desired film-forming conditions can be established by the use of at least one member selected from the group consisting of $NH_3$, $N_2H_4$, $NH(CH_3)_2$, $N_2H_3CH$, and $N_2$ listed above, in place of or in addition to the conventionally used $H_2$ gas, as a reducing gas, in the present invention. The use thereof thus permits the control of the Co nucleus-forming time period, the control of the Co film-growing rate, the improvement of the surface morphology of the resulting film, the control of the impurity concentration of the resulting film, and the reduction of the resistance of the resulting film and accordingly, the resulting Co film can be used as an adhesive layer for the formation of a fine pattern of a semiconductor device.

The foregoing first invention concerning the method for the formation of a Co film is characterized in that the barrier film is a film consisting of Ti, TiN, Ta, TaN, W, WN, or silicide.

The foregoing first invention concerning the method for the formation of a Co film is characterized in that the silicide film is a film consisting of $CoSi_2$, $TiSi_2$, $NiSi_2$, or WSi.

The foregoing first invention concerning the method for the formation of a Co film is characterized in that the cobalt alkylamidinate is $Co(tBu-Et-Et-amd)_2$.

The foregoing first invention concerning the method for the formation of a Co film is characterized in that the film-forming temperature during the step for forming the Co film falls within the range of from 180 to 400° C., preferably 180 to 300° C. and more preferably 200 to 300° C.

This is because if the film-forming temperature is less than 180° C., there are observed such tendencies that the Co nucleus-growing time period is elongated and that the Co film growth rate is low, while if the film-forming temperature exceeds 300° C., the resistivity of the resulting film shows such a tendency that it is gradually increased, and further if it exceeds 400° C., there is observed such a tendency that the film-forming rate is high, but the resistivity of the resulting film also increases.

The foregoing first invention concerning the method for the formation of a Co film is characterized in that the film-forming pressure during the step for forming the Co film falls within the range of from 50 to 1,000 Pa and preferably 100 to 1,000 Pa.

This is because if the film-forming pressure is less than 50 Pa, there are observed such tendencies that the film-forming rate is lowered and that the apparatus which makes use of the method of the present invention is not favorable as a mass production apparatus. Accordingly, the film-forming pressure is preferably not less than 100 Pa while taking into consideration the practice of the method using a mass production apparatus. On the other hand, if it exceeds 1,000 Pa, the surface of the resulting Co film tends to be considerably roughened and it would accordingly be difficult to practically use the resulting product as a film.

The foregoing first invention concerning the method for the formation of a Co film is characterized in that the ratio of the $H_2$ gas to the at least one gas (this will hereunder be referred to as "secondary reducing gas") selected from the group consisting of $NH_3$, $N_2H_4$, $NH(CH_3)_2$, $N_2H_3CH$, and $N_2$ gases to be supplied falls within the following range: $40\% \leq H_2/(H_2 + \text{secondary reducing gas}) \leq 80\%$, as expressed in terms of the ratio between the flow rates thereof.

In this respect, if the foregoing ratio of the gases to be supplied is less than 40% and exceeds 80%, the thickness (nm) of the film observed at a film-forming time period of 8 minutes tends to be reduced, while if the rate is 100% (only $H_2$), any film cannot be formed. In addition, with respect to the resistivity ($\mu\Omega\text{cm}$), if the ratio of the gases is less than 40% and exceeds 80%, it tends to become high.

The foregoing first invention concerning the method for the formation of a Co film is characterized in that the temperature of the cobalt alkylamidinate when it is supplied to the surface of the base material falls within the range of from 65 to 80° C.

This is because if the temperature of the cobalt alkylamidinate when it is supplied to the surface is less than 65° C., there are observed such tendencies that any sufficient vapor pressure thereof cannot be established and that any desired film-forming rate cannot accordingly be obtained, while if it exceeds 80° C., the compound in itself begins to undergo denaturation.

The foregoing first invention concerning the method for the formation of a Co film is characterized in that the surface of the base material is subjected to a pre-treatment with $NH_3$ gas prior to the supply of the cobalt alkylamidinate and the reducing gas to the surface. This would make the growth of a Co film easy.

The foregoing first invention concerning the method for the formation of a Co film is characterized in that Ar gas or $N_2$ gas is supplied to the surface of the base material simultaneously with the supply of the cobalt alkylamidinate and the reducing gas.

As has been described above, the simultaneous supply of an Ar gas or an $N_2$ gas can make the control of the partial pressure of the reaction system easy and it also permits the control of the Co nucleus-growing time period and the growth rate of the Co film, the improvement of the surface morphology of the resulting film, the control of the impurity concentration of the film and the reduction of the resistance of the same. Accordingly, the resulting Co film can be used in the formation of a fine pattern.

A second invention concerning the method for the formation of a Co film according to the present invention is characterized in that it comprises the steps of forming a Co film on the surface of a base material in which the surface consists of an $SiO_2$ film or a barrier film serving as a primary layer, by supplying cobalt alkylamidinate and a mixture of $H_2$ and $NH_3$ as a reducing gas and then forming a Co film at a film-forming temperature ranging from 180 to 400° C., preferably 180 to 300° C. and more preferably 200 to 300° C., according to the CVD technique.

In this respect, if the film-forming temperature is less than 180° C., there are observed such tendencies that the Co nucleus-growing time period is elongated and that the Co film-growing rate is reduced, while if it exceeds 300° C., the resistivity of the resulting film is apt to be gradually increased and if it exceeds 400° C., the film-forming rate is increased, but the resistivity of the resulting film is also increased.

The foregoing second invention concerning the method for the formation of a Co film is characterized in that the film-forming pressure during the step of forming a Co film falls within the range of from 50 to 1,000 Pa and preferably 100 to 1,000 Pa.

This is because if the film-forming pressure is less than 50 Pa, there are observed such tendencies that the film-forming rate is lowered and that the apparatus which makes use of the method of the present invention is not favorable as a mass production apparatus. Accordingly, the film-forming pressure is preferably not less than 100 Pa while taking into consideration the practice of the method using a mass production apparatus. On the other hand, if it exceeds 1,000 Pa, the surface of the resulting Co film tends to be considerably roughened and it would accordingly be difficult to practically use the resulting product as a film.

The foregoing second invention concerning the method for the formation of a Co film is characterized in that the ratio of the $H_2$ gas to $NH_3$ to be supplied as a reducing gas falls within the following range: $40\% \leq H_2/(H_2+NH_3) \leq 80\%$, as expressed in terms of the ratio between the flow rates thereof.

In this respect, if the foregoing ratio of the gases to be supplied is less than 40% and exceeds 80%, the thickness (nm) of the film observed at a film-forming time period of 8 minutes tends to be lowered, while if the rate is 100% (only $H_2$), any film cannot be formed. In addition, with respect to the resistivity ($\mu\Omega$cm), if the ratio of the gases to be supplied is less than 40% and exceeds 80%, it tends to become high.

The foregoing second invention concerning the method for the formation of a Co film is characterized in that the temperature of the cobalt alkylamidinate when it is supplied to the surface of the base material falls within the range of from 65 to 80° C.

This is because if the temperature of the cobalt alkylamidinate is supplied at a temperature of less than 65° C., there are observed such tendencies that any sufficient vapor pressure thereof cannot be established and that any desired film-forming rate cannot accordingly be obtained, while if it exceeds 80° C., the compound in itself begins to undergo denaturation.

The foregoing second invention concerning the method for the formation of a Co film is characterized in that the surface of the base material is subjected to a pre-treatment with $NH_3$ gas prior to the supply of the cobalt alkylamidinate and the $H_2$ and $NH_3$ gases, as the reducing gas, to the surface. This would make the growth of a Co film easy.

The foregoing second invention concerning the method for the formation of a Co film is characterized in that Ar gas or $N_2$ gas is supplied to the surface of the base material simultaneously with the supply of the cobalt alkylamidinate and the $H_2$ and $NH_3$ gases as the reducing gas.

As has been described above, the simultaneous supply of Ar gas or $N_2$ gas can make the control of the partial pressure of the reaction system easy and it also permits the control of the Co nucleus-growing time period and the growth rate of the Co film, the improvement of the surface morphology of the resulting film, the control of the impurity concentration of the film and the reduction of the resistance of the same. Accordingly, the resulting Co film can be used in the formation of a fine pattern.

The foregoing second invention concerning the method for the formation of a Co film is characterized in that the barrier film is one consisting of a member selected from the group consisting of Ti, TiN, Ta, TaN, W, or WN, or a silicide selected from the group consisting of $CoSi_2$, $TiSi_2$, $NiSi_2$, and WSi.

The foregoing second invention concerning the method for the formation of a Co film is characterized in that the cobalt alkylamidinate is $Co(tBu-Et-Et-amd)_2$.

A first invention concerning the method for the formation of a Cu interconnection film according to the present invention is characterized in that it comprises the steps of forming a barrier film consisting of a member selected from the group consisting of Ti, TiN, Ta, TaN, W, WN, and silicide or an $SiO_2$ film on the surface of a substrate provided thereon with holes or trenches; then forming a Co film, on the barrier film or the $SiO_2$ film, by supplying cobalt alkylamidinate, and a combined gas containing $H_2$ gas and at least one member selected from the group consisting of $NH_3$, $N_2H_4$, $NH(CH_3)_2$, $N_2H_3CH$, and $N_2$ as a reducing gas, or at least one gas selected from the group consisting of $NH_3$, $N_2H_4$, $NH(CH_3)_2$, $N_2H_3CH$, and $N_2$ as a reducing gas, on the surface of the substrate provided thereon with the barrier film or the $SiO_2$ film to thus fill up the interior of the holes or trenches formed on the substrate, whose surface has been covered with the Co film, with a Cu film; and thereafter subjecting the resulting assembly to a heat treatment at a temperature of not more than 350° C. and preferably 250 to 350° C. to thus form a Cu interconnection film.

A second invention concerning the method for the formation of a Cu interconnection film according to the present invention is characterized in that it comprises the steps of forming a barrier film consisting of a member selected from the group consisting of Ti, TiN, Ta, TaN, W, WN, and silicide or an $SiO_2$ film on the surface of a substrate provided thereon with holes or trenches; then forming a Co film, on the barrier film or the $SiO_2$ film, by supplying cobalt alkylamidinate and a combined gas containing $H_2$ gas and at least one member selected from the group consisting of $NH_3$, $N_2H_4$, $NH(CH_3)_2$, $N_2H_3CH$, and $N_2$ as a reducing gas, or at least one gas selected from the group consisting of $NH_3$, $N_2H_4$, $NH(CH_3)_2$, $N_2H_3CH$, and $N_2$ as a reducing gas, on the surface of the substrate provided thereon with the barrier film or the $SiO_2$ film; forming a Cu film as a seed film on the Co film; subsequently filling up the interior of the holes or trenches on which the seed film has been formed, with a Cu film according to the plating technique; and then subjecting the resulting assembly to a heat treatment at a temperature of not more than 350° C. and preferably 250 to 350° C. to form a Cu interconnection film.

A third invention concerning the method for the formation of a Cu interconnection film according to the present invention is characterized in that it comprises the steps of forming a barrier film on the surface of a substrate provided thereon with holes or trenches and then exposing the barrier film to the atmosphere; forming a Co film on the barrier film by supplying cobalt alkylamidinate and a combined gas containing $H_2$ gas and at least one member selected from the group consisting of $NH_3$, $N_2H_4$, $NH(CH_3)_2$, $N_2H_3CH$, and $N_2$ as a reducing gas, or at least one gas selected from the group consisting of $NH_3$, $N_2H_4$, $NH(CH_3)_2$, $N_2H_3CH$, and $N_2$ as a reducing gas, on the surface of the substrate provided thereon with the barrier film; subsequently, optionally subjecting the resulting product to the atmospheric exposure; filling up the interior of the holes or trenches, on which the Co film has been formed, with a Cu film; and then subjecting the resulting assembly to a heat treatment carried out at a temperature of not more than 350° C. and preferably 250 to 350° C. to thus form a Cu interconnection film.

A fourth invention concerning the method for the formation of a Cu interconnection film according to the present invention is characterized in that it comprises the steps of forming a barrier film on the surface of a substrate provided thereon with holes or trenches and then exposing the barrier film to the atmosphere; forming a Co film on the barrier film by supplying cobalt alkylamidinate and a combined gas containing $H_2$ gas and at least one member selected from the group consisting of $NH_3$, $N_2H_4$, $NH(CH_3)_2$, $N_2H_3CH$, and $N_2$ as a reducing gas, or at least one gas selected from the group consisting of $NH_3$, $N_2H_4$, $NH(CH_3)_2$, $N_2H_3CH$, and $N_2$ as a reducing gas, on the surface of the substrate provided thereon with the barrier film; subsequently, optionally subjecting the resulting product to the atmospheric exposure; forming a CVD-Cu film or a PVD-Cu film as a seed film on the resulting Co film; thereafter filling up the interior of the holes or trenches, on which the Co film has been formed, with a Cu film according to the plating technique; and then subjecting the resulting assembly to a heat treatment carried out at a temperature of not more than 350° C. and preferably 250 to 350° C. to thus form a Cu interconnection film.

The foregoing first to fourth inventions each concerning the method for the formation of a Cu interconnection film are characterized in that the step for the formation of the Co film is carried out according to the CVD technique at a film-forming temperature ranging from 180 to 400° C. and preferably 180 to 300° C. and more preferably 200 to 300° C., while supplying cobalt alkylamidinate and a mixture of $H_2$ and $NH_3$ gases as a reducing gas.

The foregoing first to fourth inventions concerning the method for the formation of a Cu interconnection film are each characterized in that the film-forming pressure during the step for the formation of the Co film is set at a level ranging from 50 to 1,000 Pa.

The foregoing first to fourth inventions concerning the method for the formation of a Cu interconnection film are each characterized in that the ratio of the $H_2$ gas to the $NH_3$ gas as reducing gases to be supplied falls within the following range: $40\% \leq H_2/(H_2+NH_3) \leq 80\%$, as expressed in terms of the ratio between the flow rates thereof.

The foregoing first to fourth invention concerning the method for the formation of a Cu interconnection film are each characterized in that the temperature of the cobalt alkylamidinate when it is supplied to the surface of the substrate falls within the range of from 65 to 80° C.

The foregoing first to fourth inventions concerning the method for the formation of a Cu interconnection film are each characterized in that the surface of the substrate is subjected to a pre-treatment with $NH_3$ gas prior to the supply of the cobalt alkylamidinate and the reducing gas to the surface.

The foregoing first to fourth inventions concerning the method for the formation of a Cu interconnection film are each characterized in that Ar gas or $N_2$ gas is supplied to the surface of the substrate simultaneously with the supply of the cobalt alkylamidinate and the reducing gas.

The foregoing first to fourth inventions concerning the method for the formation of a Cu interconnection film are each characterized in that the heat treatment is carried out at a temperature ranging from 250 to 350° C.

Moreover, the foregoing substrate provided thereon with an $SiO_2$ film also includes the $SiO_2$ substrate per se.

Effects of the Invention

The present invention permits the reduction of the Co nucleus-forming time period, the reduction of the resistance of the resulting Co film, the improvement of the surface morphology of the resulting film, the formation of films at a low temperature, the improvement of the throughput in the process for the production of semiconductor devices and the use of a Co film in the microfabrication technique, through the expansion of the temperature range in which the Co film can be used. Moreover, the use of a laminated film composed of a Co film and a barrier film as a primary film would permit the considerable improvement of the adhesion between the Cu interconnection film and the primary film and accordingly, the resulting Cu interconnection film is completely free of any void and further the Cu interconnection film produced according to the present invention is improved in the reliability of the interconnection such as resistance to SM and EM.

In addition, the present invention likewise makes it possible to achieve such an effect that a Co film can be formed, which can be used as an adhesive layer, a silicide layer and/or a cap layer in the process for the production of semiconductor devices.

Furthermore, the present invention would permit the achievement of such effects that a Co film can be formed by the CVD technique or the ALD technique, that such a film can be formed as a thin film and that such a Co film can be used in a larger number of processes when manufacturing semiconductor devices.

BRIEF DESCRIPTION OF THE DRAWINGS

FIGS. 1(a) and 1(b) are diagrams showing the formation of a void due to the overhang at the upper portion of a hole and FIGS. 1(c) and 1(d) are diagrams showing the formation of a void due to the asymmetric nature of the barrier film on the side wall of a hole.

FIG. 6(a) is one observed for the $H_2$-reduced Co film and FIG. 6(b) is one observed for the $H_2/NH_3$-reduced Co film.

MODE FOR CARRYING OUT THE INVENTION

Figure 1:
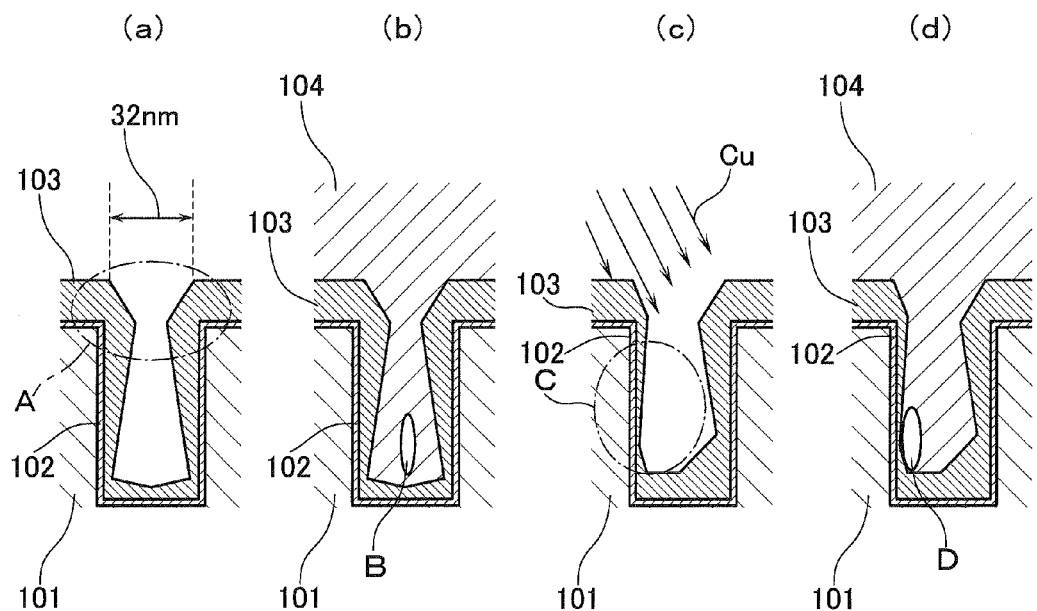
FIG. 1 shows a schematic diagram illustrating the formation of a void observed when carrying out the conventional technique and more specifically.

According to an embodiment of the method for the formation of a Co film according to the present invention, a CVD (ALD)-Co film can be produced by providing, as a base material, an $SiO_2$ film or a barrier film composed of a member selected from the group consisting of Ti, TiN, Ta, TaN, W, WN and silicide, which serves as a primary layer; supplying, on the surface of the substrate, an organometal compound comprising Co and an alkylamidinate (wherein the alkyl group is an ethyl or butyl group) such as cobalt 2-alkylamidinate, and a known reducing gas, as a reducing gas, capable of reducing this organometal compound to form a Co film, which is composed of at least one gas component selected from the group consisting of $NH_3$, $N_2H_4$, $NH(CH_3)_2$, $N_2H_3CH$, and $N_2$, or a combined gas mixture comprising $H_2$ gas and the foregoing reducing gas (among them, particularly preferably used herein is $NH_3$); and forming the desired Co film according to the CVD technique or ALD technique under the process conditions (for instance, the film-forming pressure ranging from 50 to 1,000 Pa; the base material temperature (film-forming temperature) ranging from 180 to 400° C., preferably 180 to 300° C. and more preferably 200 to 300° C.; the flow rate of the reducing gas (such as, for instance, $NH_3$) ranging from 100 to 1,000 sccm). In the present invention, the use of such a reducing gas would permit the control of the Co nucleus-growing time period, the control of the growth rate of the Co film, the improvement of the surface morphology of the Co film, the control of the impurity concentration of the film and the reduction of the resistance of the same. Accordingly, the resulting Co film can be used as the adhesive layer, the silicide layer and/or the cap layer in the formation of a fine pattern.

The foregoing organometal material consisting of a cobalt alkylamidinate may be, for instance, $Co(tBu-Et-Et-amd)_2$.

In addition, according to a preferred embodiment of the method for the formation of a Cu interconnection film relating to the present invention, the method comprises the steps of forming a barrier film composed of a member selected from the group consisting of Ti, TiN, Ta, TaN, W, WN, and silicide or an $SiO_2$ film on the surface of a substrate provided thereon with holes or trenches, in a desired thickness, according to any known method; then forming a CVD-Co film or an ALD-Co film, on the barrier film or the $SiO_2$ film according to the CVD or ALD technique under the process conditions (for instance, the film-forming pressure ranging from 50 to 1,000 Pa; the substrate temperature (film-forming temperature) ranging from 180 to 400° C., preferably 180 to 300° C. and more preferably 200 to 300° C.; the flow rate of the reducing gas (such as, for instance, $NH_3$) ranging from 100 to 1,000 sccm), while supplying, to the surface of the substrate, cobalt alkylamidinate and at least one reducing gas selected from the group consisting of $H_2$, $NH_3$, $N_2H_4$, $NH(CH_3)_2$, $N_2H_3CH$, and $N_2$, in a predetermined thickness; filling up the interior of the holes or trenches, whose surface is covered with the Co film, with a CVD-Cu film or a PVD-Cu film under the known process conditions, or forming a CVD-Cu film or a PVD-Cu film serving as a seed film on the CVD-Co film or the ALD-Co film formed in the foregoing step under the known process conditions, and then filling up the interior of the holes or trenches, whose surface is covered with the seed film, with a Cu film according to the plating technique under the known process conditions; and thereafter forming a Cu interconnection film by subjecting the resulting assembly to a heat treatment at a temperature of not more than 350° C. and preferably 250 to 350° C. over a predetermined time period. In this case, when the substrate provided thereon with holes or trenches is an $SiO_2$ substrate, a Co film can be formed on the surface of the substrate.

In the fields of, for instance, high-tec devices (such as Flash Memory), there has conventionally been used, for instance, a Ti film or a TiN film as a barrier layer (adhesive layer) for the Cu interconnection film, but the inventors of this invention have found that the Co film is excellent in the adhesion to the Cu interconnection film as compared with the Ti film, the TiN film or the like.

Figure 2:
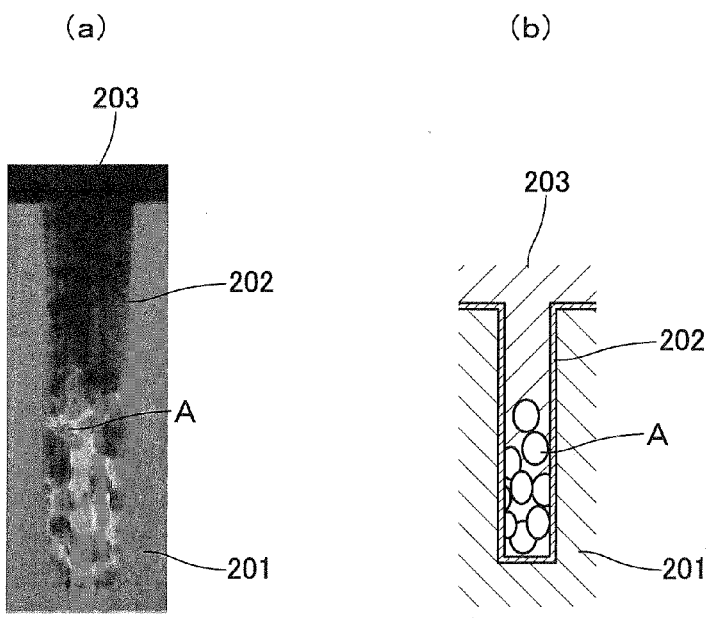
FIG. 2(a) is an SEM micrograph illustrating the formation of a void observed when carrying out the conventional technique and FIG. 2(b) is a schematic diagram illustrating the same.

As shown in FIG. 2 already discussed above, if forming a conventional ALD-TiN barrier film which is not an appropriate adhesive layer and subsequently filling up the interior of holes or trenches with a CVD-Cu film, there are observed a large number of voids generated within the holes, in the case of a hole having a diameter φ of 100 nm. This is because the Cu film is partially worn or peeled off and undergoes cohesion due to the insufficient adhesion of the CVD-Cu film to the ALD-TiN barrier film. On the other hand, if putting a CVD-Co film or an ALD-Co film as an adhesive layer between an ALD-TiN barrier film and a CVD-Cu film, the Cu film never causes any cohesion, any void is not generated within the Cu film and accordingly, the interior of holes can closely be filled up with the Cu film.

Figure 3:
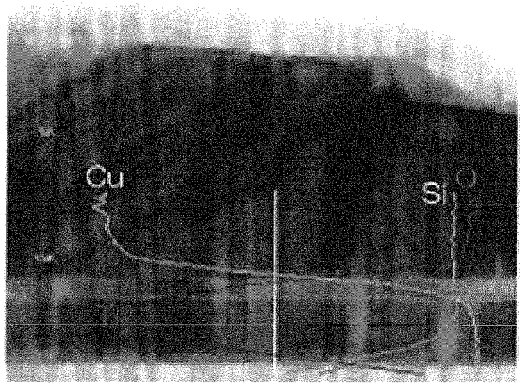
FIG. 3 shows TEM micrographs of cross sectional views of substrates, a photograph illustrating the results of the EDX analysis and a photograph illustrating the results of the tape test, which are observed when forming a Cu interconnection film according to the conventional technique and more specifically, FIGS. 3(a-1) and (a-2) are those observed for the film obtained immediately after the formation of the film and FIGS. 3(b-1) and (b-2) are those observed for the film obtained after the film is subjected to a heat treatment subsequent to the formation of the film.
Figure 3:
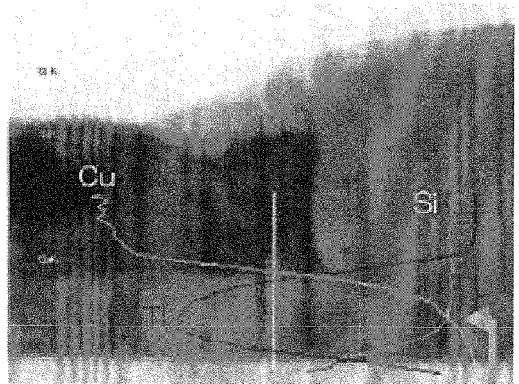
Figure 3:
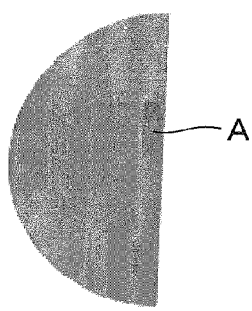
Figure 3:
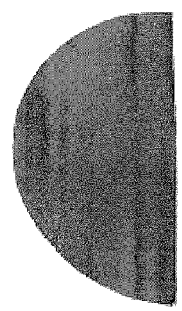

FIGS. 3(*a*-1) and 3(*b*-1) are TEM micrographs which are observed for an assembly produced by the formation of a Ti film having a thickness of 15 nm on the surface of an oxide film ($SiO_2$ film) of 100 nm thick, formed on a substrate of φ300 mm, according to the PVD technique under the known process conditions, and then forming a CVD-Cu film on the Ti film in a thickness of 1,000 nm under the known process conditions, and these TEM micrographs are taken for the purpose of observing the conditions of the interface formed between the Ti film and the Cu film and show the cross sections of the resulting assembly immediately after the formation of the films (FIG. 3(*a*-1)) and after the assembly is subjected to a heat-treatment at 350° C. for 10 minutes subsequent to the film-formation (FIG. 3(*b*-1)). There is observed the presence of an interface of about 5 nm between the Ti film and the Cu film immediately after the formation of the films. When carrying out the EDX analysis of the resulting assembly, it was found that this interfacial layer contains oxygen. Moreover, there is not any interfacial layer between the Ti film and the Cu film at all, after the assembly is subjected to a heat-treatment at 350° C. for 10 minutes subsequent to the film-formation and when carrying out the EDX analysis of the assembly, it was found that the interfacial layer is almost free of oxygen unlike the case in which the assembly is not subjected to any heat-treatment.

FIGS. 3(*a*-2) and 3(*b*-2) show the results of the known tape test carried out for the investigation of the adhesion of the Ti film to the Cu film using the substrate produced according to the foregoing procedures. In the case of the substrate as shown in FIG. 3(*a*-1), the Cu film is worn or peeled off (for instance, the portion indicated by A in FIG. 3(*a*-2)). It would be believed that this is because the adhesion between the Ti film and the Cu film is deteriorated due to the presence of the interfacial layer formed between them. On the other hand, in the case of the substrate as shown in FIG. 3(*b*-1), any interfacial layer is not observed at all due to the heat-treatment carried out at 350° C. It would be believed that this is because Cu diffuses and penetrates into the Ti film by the heat-treatment to thus form an alloy while taking into consideration the results of the Auger analysis. The adhesion increases in such a condition and accordingly, the Cu film is never worn off even in the tape test (FIG. 3(*b*-2)).

Figure 4:
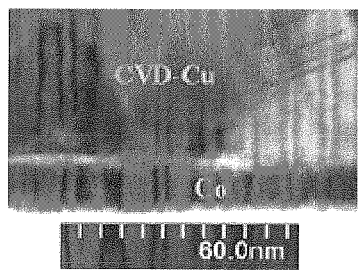
FIG. 4 shows TEM micrographs of cross sectional views of substrates, a photograph illustrating the results of the EDX analysis and a photograph illustrating the results of the tape test, which are observed when forming a Cu interconnection film according to the present invention and more specifically, FIGS. 4(a-1) and (a-2) are those observed for the film obtained immediately after the formation of the film and FIGS. 4(b-1) and (b-2) are those observed for the film obtained after the film is subjected to a heat treatment subsequent to the formation of the film.
Figure 4:
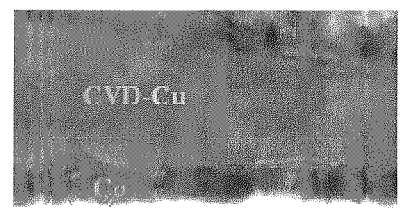
Figure 4:
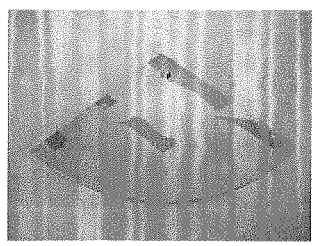
Figure 4:
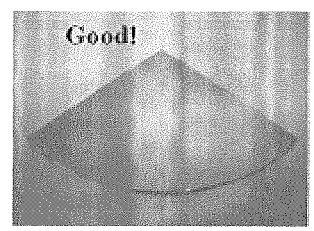

As described above, a Co film having a thickness of 15 nm was formed on an oxide film ($SiO_2$ film) having a thickness of 100 nm and deposited on the surface of a substrate of φ300 mm, according to the CVD technique under the known process conditions, while using cobalt alkylamidinate and a combined gas containing $H_2$ gas and $NH_3$ gas, thereafter a CVD-Cu film was formed on the Co film in a thickness of 1,000 nm under the known process conditions and then the resulting assembly was heated at 250° C. for 10 minutes. In this case, TEM micrographs showing the cross sections of the interface formed between the Co film and the Cu film were taken immediately after the formation of the films and after subjecting the assembly to the heat-treatment subsequent to the film-formation and shown in FIGS. 4(*a*-1) and 4(*b*-1), respectively and the results of the tape test are shown in FIGS. 4(*a*-2) and 4(*b*-2), respectively. In the case of Co film, there is observed the presence of an interfacial layer as in the case of the Ti film, but the thickness of the Co film is 2.6 nm which is almost half of that of the Ti film and the results of the tape test indicate that the Cu film is peeled off. On the other hand, such an interfacial layer is disappeared after the assembly is heat-treated at 250° C. for 10 minutes. For this reason, the results of the tape test indicate that the Cu film is never peeled off. Thus the Cu interconnection film formed after the heat-treatment carried out at 250° C. is quite excellent in the adhesion between the Cu interconnection film and the Co film and accordingly, the resulting Cu interconnection film is completely free of any void and has improved reliability of the interconnections such as the resistance to SM and EM.

As will be clear from the foregoing, the use of Co film permits the reduction of the thickness (about half) of the interfacial layer formed as compared with that formed when using the Ti film (about half of the latter) and as a result, the following merit will be anticipated: the desired adhesion between the Co film and the Cu film can be ensured even at a heat-treatment temperature of 250° C. which is considerably lower than that used in the case of the Ti film (350° C.). It would be interpreted that the reduction of the thickness of the interfacial layer can be ascribable to the fact that Co is hardly oxidized as compared with Ti. It would be assumed that the hardly oxidizable properties of Co likewise make it difficult for the Co film to be corroded with a halogenous element such as fluorine or chlorine. This would be quite advantageous when using CVD-Cu raw materials which may frequently contain impurities such as O, F, C, and Cl.

Figure 5:
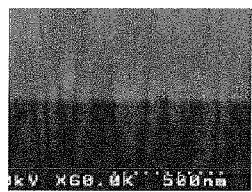
FIG. 5 shows SEM micrographs of the substrate surface observed when forming Cu interconnection films according to the present invention and according to the conventional technique and more specifically, FIGS. 5(a-1) to (a-4) are those observed when the Cu film is formed according to the conventional technique, while FIGS. 5(b-1) to (b-4) are those observed when the Cu film is formed according to the present invention.
Figure 5:
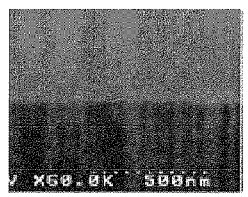
Figure 5:
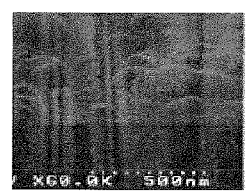
Figure 5:
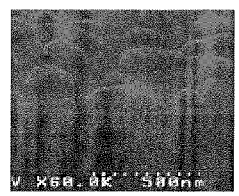
Figure 5:
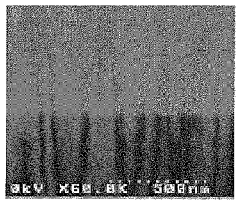
Figure 5:
Figure 5:
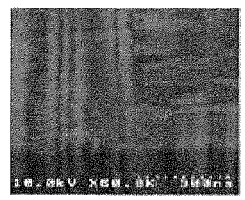
Figure 5:
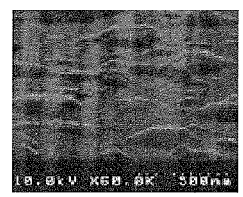

FIG. 5 shows SEM micrographs of the surfaces of Cu films each obtained by forming a CVD-Cu film having a thickness of 10 nm on a PVD-Ti film or a CVD-Co film, under the known process conditions and then subjecting the resulting assembly to a heat-treatment at a predetermined temperature for a predetermined time period.

FIGS. 5(*a*-1) to 5(*a*-4) show SEM micrographs taken at a predetermined angle from the surface of the Cu film described below and more specifically, an SEM micrograph taken immediately after forming a PVD-Ti film of 15 nm thick as a primary film and then forming a PVD-Cu film of 10 nm thick on the primary film without the break of vacuum (the release of vacuum) (FIG. 5(*a*-1)); that taken after forming a Ti film, forming a Cu film without the break of vacuum (the release of vacuum) and then subjecting the resulting film assembly to a heat-treatment at 400° C. for one hour (FIG. 5(*a*-2)); that taken after forming a Ti film, exposing the Ti film to the atmosphere, forming a Cu film and then subjecting the resulting film assembly to a heat-treatment at 300° C. for one hour (FIG. 5(*a*-3)); and that taken after forming a Ti film, exposing the Ti film to the atmosphere, forming a Cu film and then subjecting the resulting film assembly to a heat-treatment at 400° C. for one hour (FIG. 5(*a*-4)).

FIGS. 5(*b*-1) to 5(*b*-4) show SEM micrographs taken at a predetermined angle from the surface of the Cu film described below and more specifically, an SEM micrograph taken immediately after forming a CVD-Co film of 15 nm thick as a primary film and then forming a PVD-Cu film of 10 nm thick on the primary film without the break of vacuum (the release of vacuum) (FIG. 5(*b*-1)); that taken after forming a Co film, forming a Cu film without the break of vacuum (the release of vacuum) and then subjecting the resulting film assembly to a heat-treatment at 400° C. for one hour (FIG. 5(*b*-2)); that taken after forming a Co film, exposing the Co film to the atmosphere, forming a Cu film and then subjecting the resulting film assembly to a heat-treatment at 300° C. for one hour (FIG. 5(*b*-3)); and that taken after forming a Co film, exposing the Co film to the atmosphere, forming a Cu film and then subjecting the resulting film assembly to a heat-treatment at 400° C. for one hour (FIG. 5(*b*-4)).

When the adhesion between the primary film and the Cu film is insufficient, the Cu film is peeled off from the primary film and undergoes cohesion due to the surface tension of the film.

As will be clear from FIGS. 5(*a*-1) to 5(*a*-2) and FIGS. 5(*b*-1) to 5(*b*-2), the both Ti film and Co film are never accompanied by any cohesion or separation of the Cu film from the same in both of the cases wherein the Cu film is formed without the break of vacuum after the formation of the films and wherein the films are heat-treated at 400° C. after the formation of the Cu film. In other words, the adhesion between the Ti or Co film and the Cu film is satisfied in both of these cases.

On the other hand, if a Ti film or a Co film is formed, the film thus formed is then exposed to atmosphere, a Cu film is formed on the Ti or Co film and then each resulting film assembly is heat-treated, there are observed difference in the adhesion between these two cases. As will be clear from FIGS. 5(a-3) to 5(a-4) and FIGS. 5(b-3) to 5(b-4), the Cu film undergoes quite conspicuous cohesion at the heat-treatment temperatures of 300° C. and 400° C., in the case of the Ti film, but the Cu film very slightly undergoes cohesion at the heat-treatment temperature of 300° C. and never coheres completely even at the heat-treatment temperature of 400° C., in the case of the Co film. This fact would clearly indicate that the adhesion between the Ti film and the Cu film is deteriorated in the case of the Ti film, because of the formation of an oxide on the surface of the Ti film when exposing the same to the atmosphere, while any oxidation never proceeds in the case of the Co film and therefore, the surface thereof certainly holds the desired characteristics of the metal film and the excellent adhesion between the Co and Cu films can thus be ensured. Accordingly, when the primary film consists of a Co film, the heat-treatment temperature is not more than 350° C. and preferably not more than 300° C. In addition, it would be concluded that the lower limit thereof is 250° C. while taking into account the results shown in FIG. 4.

As has been discussed above, the present invention permits the use of a laminate film composed of a Co film and a barrier film as a primary film. Usable as such a barrier film arranged beneath the Co film are films composed of a member selected from the group consisting of Ti, TiN, Ta, TaN, W, WN, and silicide, and it is desirable that the barrier film should be uniformly formed on the internal surfaces of very fine holes or trenches. To this end, preferably used herein are W films and TiN films prepared by the ALD technique and CVD technique, which are hardly accompanied by the occurrence of defects such as asymmetry and overhang upon the formation of such films and which can provide uniform films, with TiN being most preferred.

In the present invention, the substrate is not restricted to any particular one inasmuch as it is usable in the semiconductor device.

Example 1

In this Example, a sample was prepared by forming a Co film of 10 nm thick on the surface of an $SiO_2$ substrate according to the CVD technique at a film-forming pressure of 500 Pa and a substrate temperature of 300° C., while using 200 sccm of $H_2$ as a reducing gas and $Co(tBu-Et-Et-amd)_2$ as an organometal material (this sample will hereunder be referred to as "$H_2$-reduced Co film") and another sample was prepared by forming a Co film having the same thickness on the same substrate according to the CVD technique under the following process conditions: film-forming pressure of 500 Pa and substrate temperature of 300° C., while using the same organometal material and a mixed gas composed of $H_2$ (400 sccm) and $NH_3$ (500 sccm) as a reducing gas (this sample will hereunder be referred to as "$H_2/NH_3$-reduced Co film") and these samples were inspected for the surface morphology.

Figure 6:
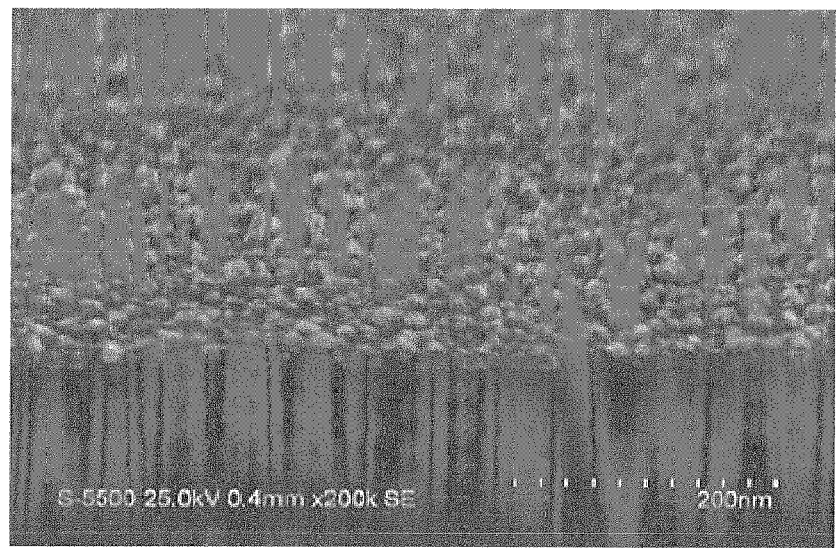
FIG. 6 shows SEM micrographs of the surface of the substrate obtained in Example 1 and more specifically.
Figure 6:
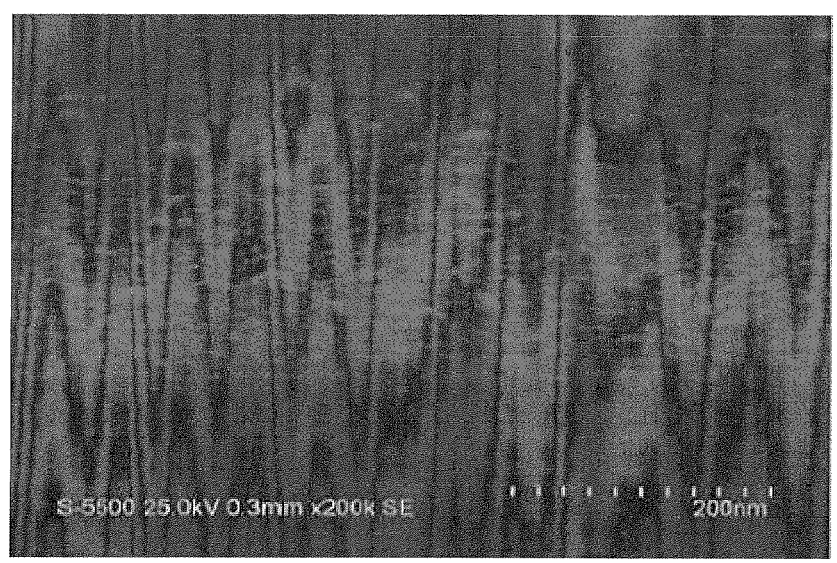

The results thus obtained are shown in FIGS. 6(a) and 6(b). In the case of the $H_2/NH_3$-reduced Co film (FIG. 6(b)), the surface is smooth as compared with that observed for the $H_2$-reduced Co film (FIG. 6(a)) and this indicates that the former is highly improved in the surface morphology. Accordingly, the $H_2/NH_3$-reduced Co film is believed to be more preferred. Moreover, the resistivity or specific resistance determined at this stage was found to be 150 μΩcm for the $H_2$-reduced Co film, while that observed for the $H_2/NH_3$-reduced Co film was found to be 100 μΩcm. In other words, the $H_2/NH_3$-reduced Co film was found to have a low resistance as compared with the $H_2$-reduced Co film. In this respect, the smoothening of the film surface and the reduction of the resistance thereof by the use of $NH_3$ as a reducing gas would be ascribable to the content of impurities in the film.

Example 2

In this Example, a Co film was formed on the surface of an $SiO_2$ substrate according to the CVD technique under the following process conditions: film-forming pressure of 500 Pa; substrate temperature of 300° C.; and flow rate of reducing gas ($NH_3$) of 500 sccm, while using the same organometal material and only $NH_3$ as a reducing gas (hereunder referred to as "$NH_3$-reduced Co film") and a Co film was formed on the same substrate according to the CVD technique under the following process conditions: film-forming pressure of 500 Pa; substrate temperature of 300° C.; and flow rate of reducing gas ($H_2$) of 500 sccm, while using the same organometal material and a reducing gas consisting of only $H_2$ (hereunder referred to as "$H_2$-reduced Co film"). These two cases were inspected for the relation between the film-forming time period (min) and the thickness of the resulting film (nm). In this connection, the thickness of the resulting film corresponds to the film-forming rate per unit time.

Figure 7:
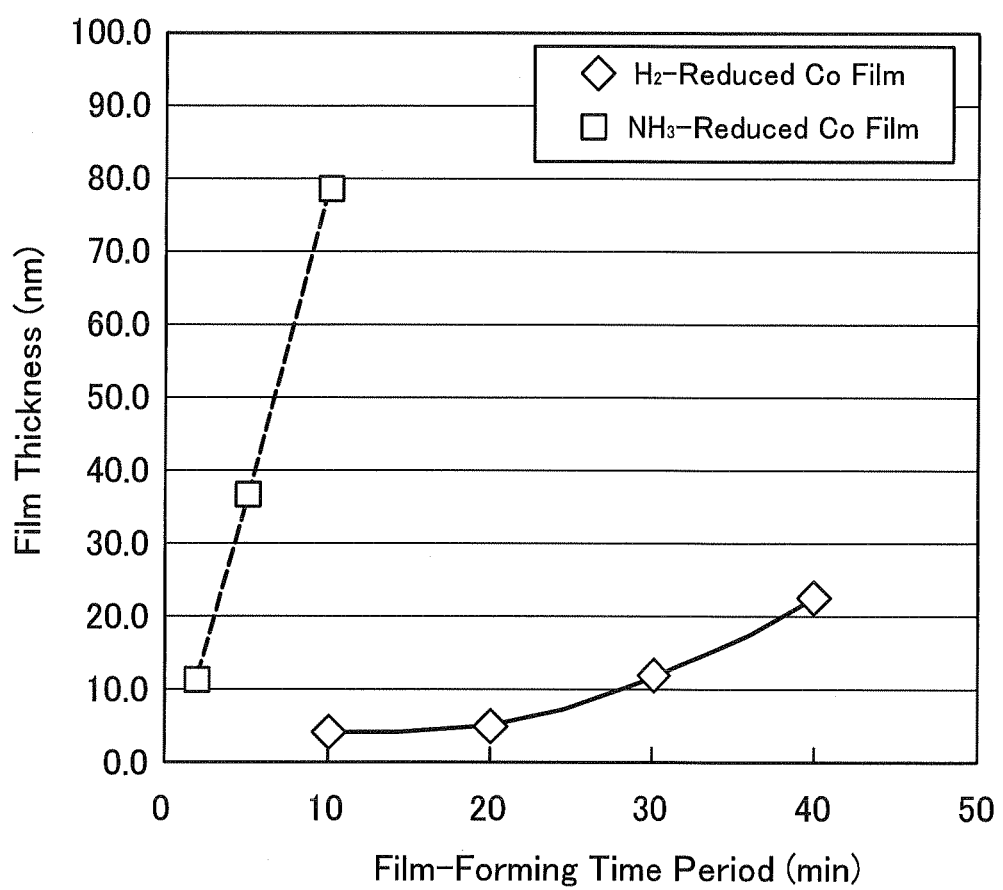
FIG. 7 is a graph illustrating the relation between the film-forming time period (min) and the film thickness (nm) corresponding to the film-forming rate per unit time (1 nm/min), observed for the $H_2/NH_3$-reduced Co film and the $H_2$-reduced Co film, produced in Example 2.

The results obtained in the foregoing inspection are plotted on FIG. 7. As will be clear from the data plotted on FIG. 7, the film-forming rate and the nucleus-forming (nucleation) time period were found to be 1 nm/min and 20 minutes, respectively for the $H_2$-reduced Co film. Contrary to this, the film-forming rate and the nucleus-forming time period were found to be 8 nm/min and zero, respectively for the $NH_3$-reduced Co film and this indicates that nuclei are immediately formed and the film-formation is simultaneously initiated. Therefore, more preferably used herein is the $NH_3$-reduced Co film.

It would be believed as follows: The partial pressure of Co would be increased due to the acceleration of the decomposition of raw materials by the action of $NH_3$ radicals and as a result, this accordingly permits the achievement of the foregoing results attributable to the reduction of the impurity content due to the use of $NH_3$ as a reducing gas and, more specifically, the smoothening of the surface of the resulting film, the reduction of the resistance of the film, the improvement of the film-forming rate and the reduction of the nucleation time.

Example 3

In this Example, the same procedures used in Example 2 were repeated except that one member selected from the group consisting of $N_2H_4$, $NH(CH_3)_2$, $N_2H_3CH$, and $N_2$ was used as a reducing gas in place of $NH_3$, to thus form each corresponding Co film. As a result, it was found that the nuclei of Co grew quite desirably and a Co film was formed at a desired film-forming rate, in any case.

Example 4

In this Example, the same procedures used in Example 2 were repeated except that a Ta film, a TaN film, a W film or a WN film was used as a barrier film and a mixture of $H_2$ gas and $NH_3$ gas or $NH_3$ gas was used as a reducing gas to thus form each corresponding Co film. As a result, it was found that the nuclei of Co grew quite desirably and a Co film was formed at a desired film-forming rate, in any case.

Example 5

In this Example, the Co film serving as an adhesive layer will be described in detail with reference to FIGS. 8 and 9. In this respect, FIG. 8 is an SEM micrograph of the surface of the resulting wafer, while FIG. 9 is a schematic cross sectional view of the resulting wafer.

First of all, a Ti film 901 having a thickness of 3 nm was formed, as a barrier film, on the surface of an $SiO_2$ wafer of φ300 mm, on which holes and trenches had been formed, according to the PVD technique film, followed by growing a Co film 902 of 5 nm thick on the Ti film 901, according to the CVD technique under the following process conditions: film-forming pressure of 500 Pa; substrate temperature of 300° C., while using $Co(tBu-Et-Et-amd)_2$ as an organometal material and a mixture containing $H_2$ gas (400 sccm) and $NH_3$ gas (500 sccm), or $NH_3$ gas (500 sccm) as a reducing gas. Then the internal surfaces of the holes or trenches present on the wafer were filled up with Cu 903 according to the CVD technique (film-forming pressure: 200 Pa; substrate temperature of 200° C.), or the plating technique.

Figure 8:
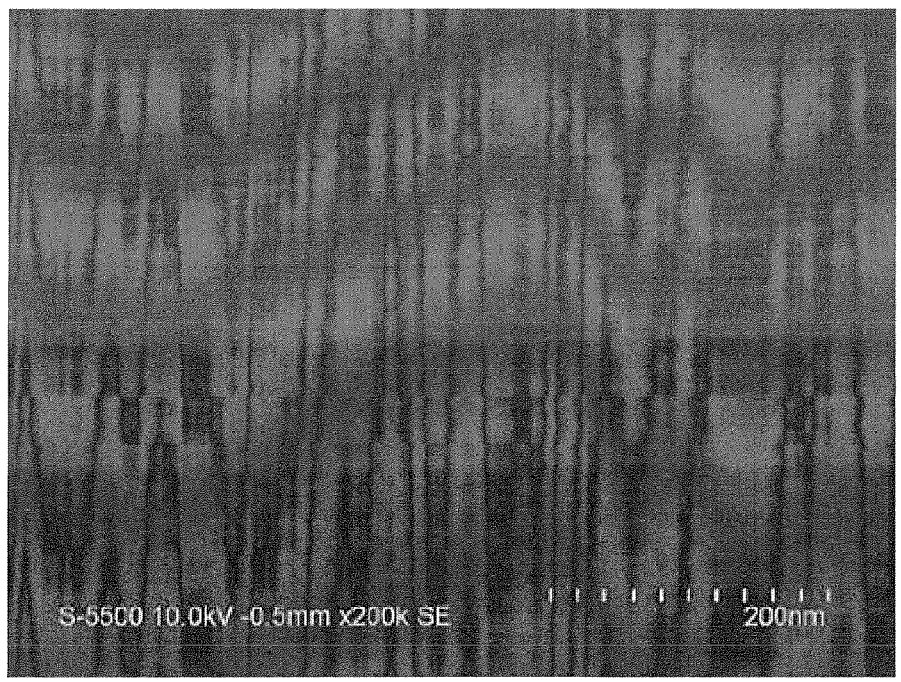
FIG. 8 is an SEM micrograph of the surface of the wafer obtained in Example 5.
Figure 9:
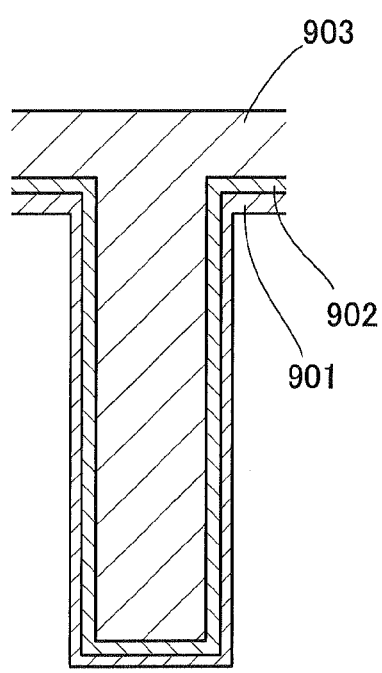
FIG. 9 is a schematic cross sectional view of the wafer obtained in Example 5.

The results obtained using the $H_2/NH_3$ gas mixture, as the reducing gas, are shown in FIGS. 8 and 9. The surface morphology observed for the resulting wafer was found to be quite desirable and there was not observed the generation of any void in the resulting Cu film. The same results observed when using the $H_2/NH_3$ gas mixture were also obtained even when $NH_3$ gas was used as the reducing gas.

Example 6

In this Example, a TiN film having a thickness ranging from 1.5 nm to 3.0 nm was formed, as a barrier film, on the surface of an $SiO_2$ wafer of φ300 mm, on which holes and trenches had been formed, according to the ALD technique under the following process conditions: film-forming pressure ranging from several Pa to several tens of Pa; and film-forming temperature of 350° C., while using $TiCl_4$ as a raw material, followed by growing a CVD-Co film having a thickness ranging from 1.5 nm to 3.0 nm on the surface of the TiN film according to the same procedures used in Example 5. Then the internal surfaces of the holes or trenches present on the wafer were filled up with Cu according to the CVD technique or the plating technique as in the case of Example 2. Even the TiN film and the Co film each having a thickness as specified above likewise show excellent surface morphology and there was not observed the formation of any void within the Cu film.

Example 7

In this Example, a Cu interconnection film was prepared using a wafer of φ300 mm having a hole pattern whose holes each have a diameter φ of 100 nm and an aspect ratio (AR) of 5.

First, a TiN barrier film was formed on the surface of the foregoing wafer in a thickness of 3 nm, according to the Cat-ALD technique (raw material: $TiCl_4$; film-forming temperature: 350° C.; and film-forming pressure: several Pa to several tens of Pa). After the formation of the ALD-TiN barrier film, the film was exposed to the atmosphere, then an $H_2/NH_3$-reduced Co film of 3 nm thick was formed on the barrier film according to the same method used in Example 1, the resulting assembly was again exposed to the atmosphere and thereafter a Cu film was formed on the Co film in a thickness of 100 nm, according to the CVD technique (film-forming temperature: 200° C.; film-forming pressure: 500 Pa). Subsequently, the assembly was heat-treated at 250° C. for one hour. As a result, it was found that any void is not generated in the resulting Cu film and that the interior of the holes are closely filled up with the CVD-Cu film, as seen from the SEM micrograph.

Moreover, even in the case of the assembly in which the Cu film was formed according to the PVD technique (film-forming temperature: −20° C.; film-forming pressure: 0.5 Pa), and when the heat-treatment after the formation of the Cu film was carried out at temperatures of 200° C. and 300° C., it was also found that any void is not generated in the resulting Cu film and that the holes are closely filled up with the CVD-Cu film, like the foregoing case.

Furthermore, even when a CVD-Cu film was continuously produced from its raw material to the final product in a vacuum without relieving the same and in other words, the final Cu film was formed without exposing the assembly to the atmosphere after the formation of the Co film as described above, it was found that any void is not generated in the resulting Cu film and that the holes are closely filled up with the CVD-Cu film, like the foregoing case.

Example 8

Figure 10:
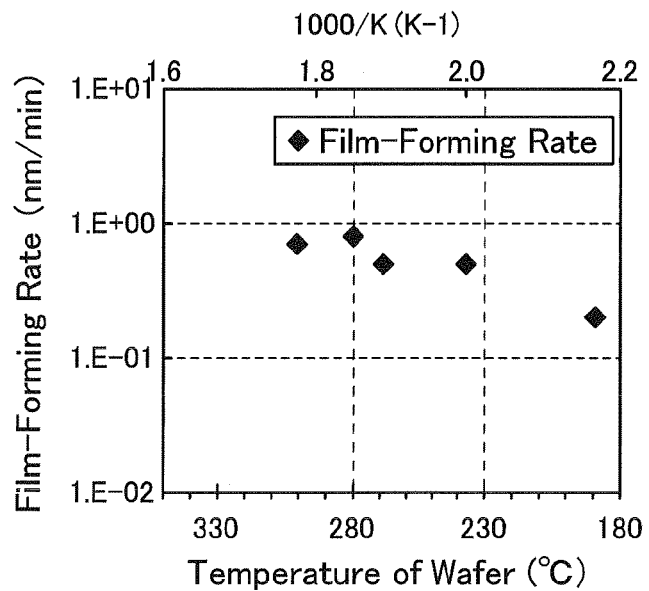
FIG. 10 is a graph showing the relation between the substrate temperature (wafer temperature) and the film-forming rate, observed for the Co film produced in Example 8.

In this Example, an $SiO_2$ film was first formed on an Si substrate of 300 mmφ; then a Co film was formed on the surface of the $SiO_2$ film according to the CVD technique under the following process conditions: film-forming pressure: 200 Pa; and substrate temperature (film-forming temperature): 180 to 350° C., while supplying, to the surface of the $SiO_2$ film, $Co(tBu-Et-Et-amd)_2$ as an organometal material, and a mixture of 200 sccm of $H_2$ gas and 100 sccm of $NH_3$ gas as a reducing gas to thus inspect the film-forming process for the relation between the substrate temperature and the film-forming rate. In the foregoing film-forming process, 100 sccm of Ar gas was simultaneously flown through the reaction chamber. The results thus obtained are plotted on FIG. 10. In FIG. 10, the substrate temperature (wafer temperature, ° C.) is plotted as abscissa and the film-forming rate (nm/min) is plotted as ordinate. As will be clear from the data plotted on FIG. 10, the film-forming rate increases along with the increase of the substrate temperature.

Figure 11:
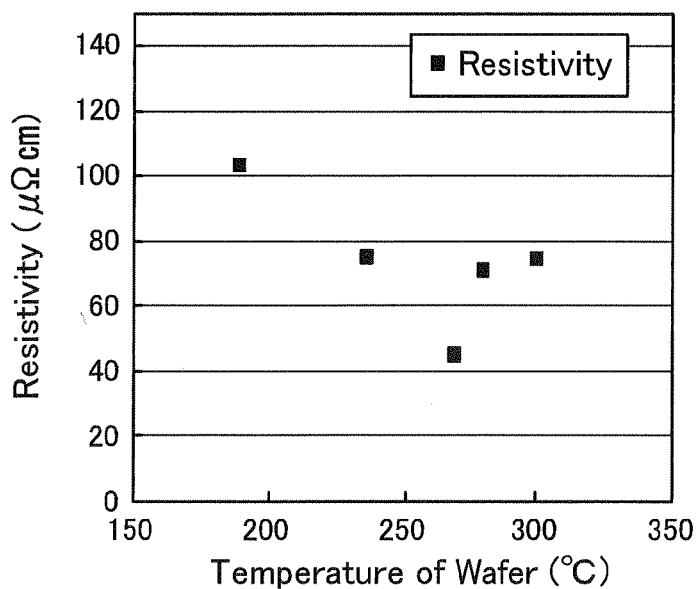
FIG. 11 is a graph showing the relation between the substrate temperature and the resistivity observed for the Co film produced in Example 8.

In addition, the resistivity of the Co film produced according to the foregoing procedures was determined by a known method. The results thus obtained are plotted on FIG. 11. In FIG. 11, the substrate temperature (wafer temperature, ° C.) is plotted as abscissa and the resistivity (μΩcm) is plotted as ordinate. As will be clear from the data plotted on FIG. 11, if the film-forming temperature is low, the resulting Co film has a high resistivity. At a film-forming temperature of 350° C. (data are not shown in the figure), the Co film was found to have a resistivity of 95 μΩcm. It was confirmed, from the results obtained through the analysis of the film composition according to the AES (Auger electron spectroscopy), that the reason why the resistivity of the film increases in a region, in which the film-forming temperature is low, is that N (nitrogen) present in the starting $Co(tBu-Et-Et-amd)_2$ is included or remains in the resulting Co film. On the other hand, it was also confirmed, from the results obtained by the same analysis, that the reason why the resistivity of the film again increases as the film-forming temperature increases is that C (carbon) present in $Co(tBu-Et-Et-amd)_2$ used as a raw material is incorporated into the final Co film.

Thus, as will be seen from the data plotted on FIGS. 10 and 11, the film-forming temperature should be set at a level ranging from 180 to 400° C., preferably 180 to 300° C. and more preferably 200 to 300° C., while taking into consideration the results of the film-forming rate and the resistivity of the resulting film. In this respect, the foregoing film-production process may easily be handled at lower film-forming temperature while taking into account the use of a mass production apparatus, but the resistivity of the resulting Co film is apt to be increased if the film-forming temperature is too low and therefore, the film-forming temperature should be controlled depending on each particular purpose. The use of the film-forming temperature of less than 180° C. is not practical since the film-forming rate is too low while taking into consideration the fact that, in an actual device, it would be required for the production of a film having a thickness on the order of from about 3 nm to about 10 nm. Moreover, the film-forming temperature is preferably set at a level ranging from 180 to 300° C. and more preferably 230 to 300° C. while taking into consideration the film-forming temperature and the resistivity of the resulting film.

In this Example, the experiments were carried out using a mixture of $H_2$ gas and $NH_3$ gas as a reducing gas. However, it was confirmed that the same results could be obtained even when using other reducing gases listed above instead of $NH_3$ gas.

Example 9

In this Example, an $SiO_2$ film was formed on the surface of an Si substrate of 300 mmφ, and a Co film was then formed on the $SiO_2$ film according to the CVD technique under the following process conditions: film-forming pressure ranging from 50 to 1,500 Pa and substrate temperature (film-forming temperature) of 250° C., while supplying, onto the surface of the $SiO_2$ film, $Co(tBu-Et-Et-amd)_2$ as an organometal material and a mixture of $H_2$ gas (200 sccm) and $NH_3$ gas (100 sccm) as a reducing gas to thus investigate the relation between the film-forming pressure and the film-forming rate. In the foregoing film-forming process, 100 sccm of Ar gas was simultaneously passed through the reaction chamber.

Figure 12:
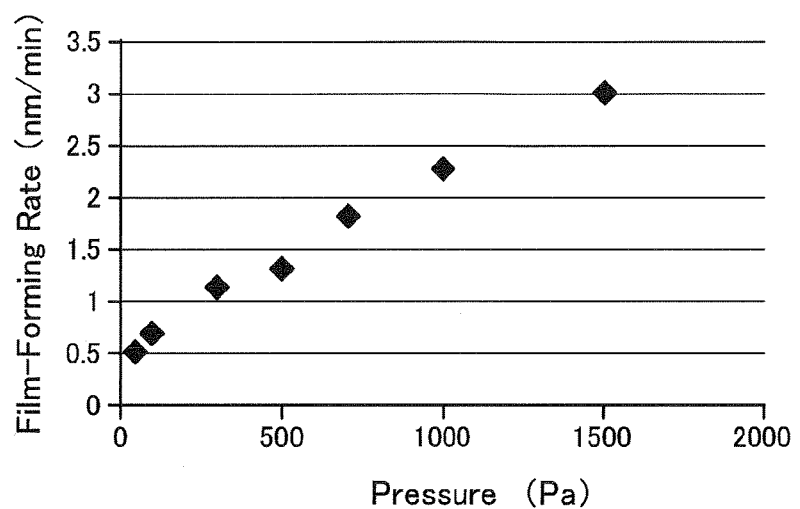
FIG. 12 is a graph showing the relation between the film-forming pressure and the film-forming rate observed for the Co film produced in Example 9.
Figure 13:
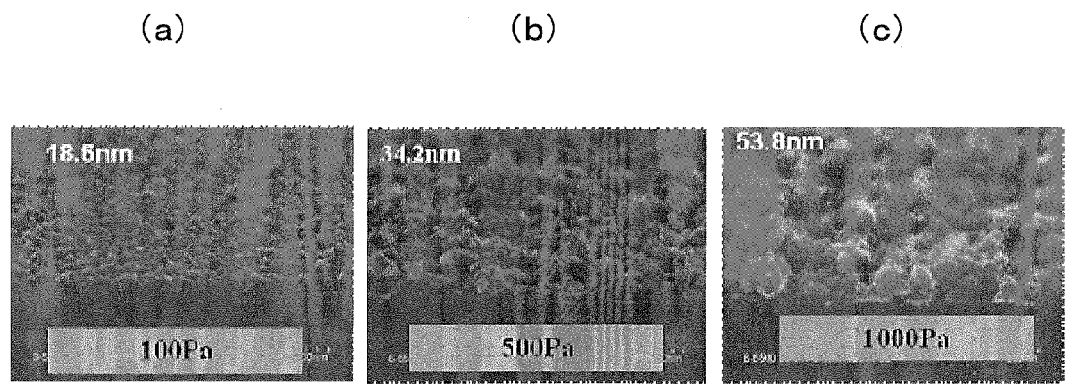
FIG. 13 is an SEM micrograph used for the observation of the surface morphology of the Co film produced in Example 9 and more specifically, FIG. 13(*a*) is one observed when using a film-forming pressure of 100 Pa, FIG. 13(*b*) is one observed when using a film-forming pressure of 500 Pa and FIG. 13(*c*) is one observed when using a film-forming pressure of 1,000 Pa.

The results thus obtained are plotted on FIG. 12. In FIG. 12, the film-forming pressure (Pa) is plotted as abscissa and the film-forming rate (nm/min) is plotted as ordinate. The data plotted on FIG. 12 clearly indicate that the film-forming rate increases as the film-forming pressure increases. In addition, SEM micrographs were taken for the Co films obtained at film-forming pressures of 100 Pa, 500 Pa and 1,000 Pa for the purpose of inspecting them for the surface morphology and the results are shown in FIGS. 13(a) to 13(c). As will be clear from FIGS. 12 and 13, the film-forming rate is less than 0.5 nm/min at a film-forming pressure of 50 Pa and this corresponds to the practical lower limit, but if the film-forming pressure is less than 50 Pa, the resulting film-forming rate is too low and therefore, there is such a tendency that this method is not favorable for use in a mass production apparatus. The film-forming pressure is preferably not less than 100 Pa, while taking into consideration the use of a mass production apparatus. Moreover, if the pressure exceeds 1,000 Pa, the resulting Co film would be unsatisfied since it has such a tendency that the surface thereof is considerably roughened and accordingly, it would be quite difficult for the resulting product to use as a film.

When the Co film was converted into a silicide through heating after the formation thereof, it was found that the surface roughness of the film is proportional to the microscopic uniformity of the resulting silicide. This also indicates that the surface of the resulting film is roughened if the film-forming pressure exceeds 1,000 Pa and accordingly, the film cannot be used for the purpose of achieving the object of the present invention.

Example 10

In this Example, an $SiO_2$ film was formed on the surface of an Si substrate of 300 mmφ, and then a Co film was formed on the $SiO_2$ film according to the CVD technique under the following process conditions: film-forming pressure: 200 Pa; substrate temperature (film-forming temperature): 250° C.; film-forming time period: 8 minutes, while supplying, onto the surface of the $SiO_2$ film, $Co(tBu-Et-Et-amd)_2$ as an organometal material and 800 sccm of a mixed gas containing $H_2$ gas and $NH_3$ gas as a reducing gas to examine the relation between the composition of the gas mixture as the reducing gas and the film-forming rate (the film thickness (nm) observed at a film-forming time period of 8 minutes) or the resistivity (μΩcm) of the resulting film. In the foregoing film-forming process, 100 sccm of Ar gas was simultaneously passed through the reaction chamber.

Figure 14:
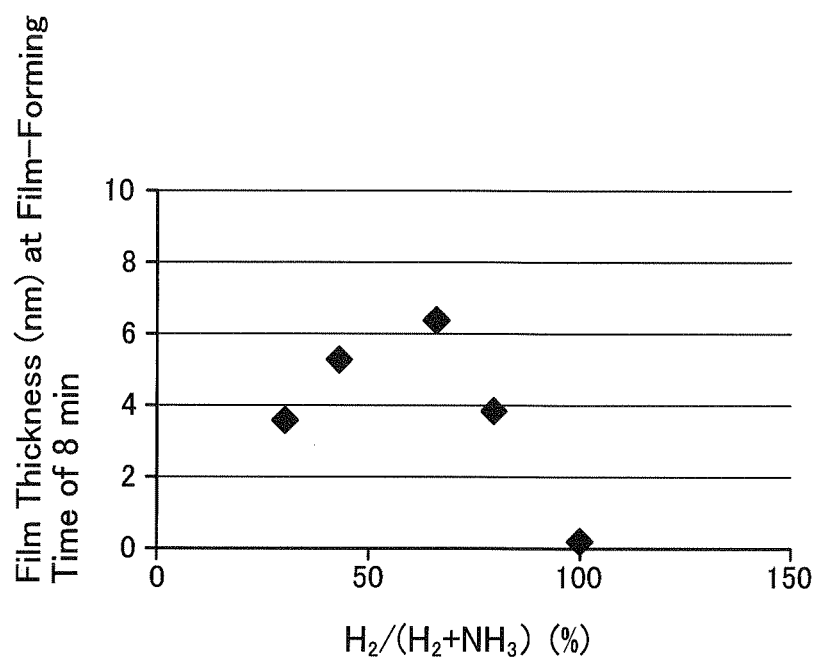
FIG. 14 is a graph showing the relation between the ratio of the reducing gases supplied to the surface of a substrate and the thickness of the film, observed when the film formation is almost 80% finished, with respect to the Co film produced in Example 10.
Figure 15:
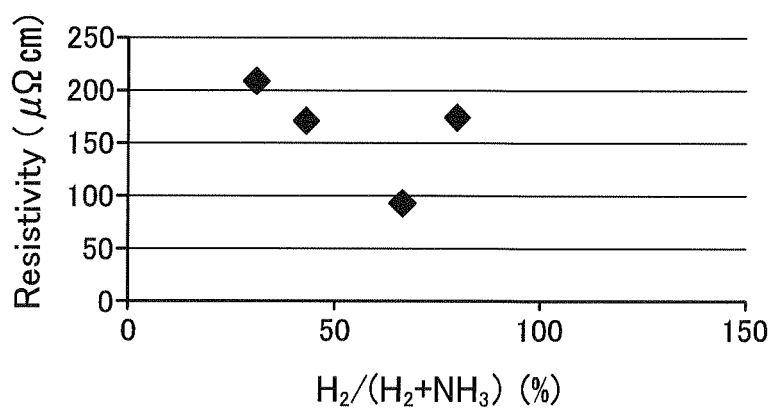
FIG. 15 is a graph showing the relation between the ratio of the reducing gases supplied to the surface of a substrate and the resistivity of the film, observed for the Co film produced in Example 10.

The results thus obtained are plotted on FIGS. 14 and 15. In FIG. 14, the composition (ratio: $H_2/(H_2+NH_3)$) by flow rate (%)) of the reducing gas is plotted as abscissa and the film thickness (nm) observed at a film-forming time period of 8 minutes is plotted as ordinate, while. in FIG. 15, the composition (ratio: $H_2/(H_2+NH_3)$) by flow rate (%)) of the reducing gas is plotted as abscissa and the resistivity (μΩcm) of the resulting film is plotted as ordinate. The data plotted on FIGS. 14 and 15 clearly indicate that the resulting film has a desired thickness and a desired resistivity when the ratio between the reducing gases, based on the flow rate, falls within the following range: $40\% \leq [H_2/(H_2+NH_3)] \leq 80\%$, while taking into consideration the foregoing results concerning the thickness and resistivity of the resulting film. In this respect, if the ratio between the flow rates is less than 40% and exceeds 80%, the thickness of the resulting film tends to be decreased, while the resistivity tends to increase. Contrary to this, if the ratio between the flow rates falls within the range specified above, the resulting film surely has a low resistivity of not more than about 200 μΩcm. If the resistivity of the resulting Co film is not more than about 200 μΩcm, a Cu film can directly be plated on the Co film.

Although the foregoing experiments were carried out using a mixture of $H_2$ gas and $NH_3$ gas as a reducing gas in this Example, it was confirmed that the same results can be obtained even if using the reducing gases listed above in place of $NH_3$ gas.

INDUSTRIAL APPLICABILITY

The present invention concerning the production of a Co film certainly permits the reduction of the Co nucleus-forming time period, the reduction of the resistance of the resulting Co film, the improvement of the surface morphology thereof, the formation of films at a low temperature, and the improvement of the throughput in the process for the production of semiconductor devices, and the present invention likewise surely permits the use of a Co film, as an adhesive layer, a silicide film and/or a capping film in the fine pattern-fabrication techniques, through the expansion of the temperature range in which the Co film can be used. Accordingly, the present invention can be used in the field of the semiconductor device-manufacturing techniques.

In addition, according to the present invention, if using a laminated film composed of a Co film and a barrier film as a primary layer in the semiconductor device-manufacturing processes, the adhesion of the Cu interconnection film to the primary layer can considerably be improved and this in turn leads to the formation of an extremely excellent Cu interconnection film free of any void and the improvement of the reliability of the interconnection such as the resistance to SM and EM. Thus the present invention can be used in the field of the semiconductor device-production technology.

DESCRIPTION OF SYMBOLS AND/OR REFERENCE NUMERALS

101: Substrate; 102: barrier film; 103: PVD-seed film; 104: Cu film; 201: Substrate; 202 TiN barrier film; 203: CVD-Cu film; 901: Ti film; 902: Co film; 903: Cu

What is claimed is:

1. A method for forming a Co film characterized in that it comprises the step of forming a Co film by supplying cobalt alkylamidinate
   with at least one gas selected from the group consisting of $NH_3$, $H_2H_4$, $NH(CH_3)_2$, $N_2H_3CH$, and $N_2$ as a reducing gas, and
   optionally with $H_2$ gas,
   on a surface of a base material, which consists of an $SiO_2$ film or a barrier film serving as a primary layer.

2. The method for forming a Co film as set forth in claim 1, wherein the barrier film is a film consisting of Ti, TiN, Ta, TaN, W, WN, or silicide.

3. The method for forming a Co film as set forth in claim 2, wherein the silicide film is a film consisting of $CoSi_2$, $TiSi_2$, $NiSi_2$, or WSi.

4. The method for forming a Co film as set forth in claim 1, wherein the cobalt alkylamidinate is $Co(tBu\text{-}Et\text{-}Et\text{-}amd)_2$.

5. The method for forming a Co film as set forth in claim 1, wherein a film-forming temperature used during the step of forming the Co film falls within the range of from 180 to 400° C.

6. The method for forming a Co film as set forth in claim 1, wherein a film-forming pressure used during the step of forming the Co film falls within the range of from 50 to 1,000 Pa.

7. The method for forming a Co film as set forth in claim 1, wherein $H_2$ gas is supplied with the reducing gas and a ratio of the $H_2$ gas to the reducing gas falls within the following range: $40\% \leq H_2/(H_2+\text{the reducing gas}) \leq 80\%$, as expressed in terms of the ratio between the flow rates thereof.

8. The method for forming a Co film as set forth in claim 1, wherein a temperature of the cobalt alkylamidinate when it is supplied to the surface of the base material falls within the range of from 65 to 80° C.

9. The method for forming a Co film as set forth in claim 1, wherein the surface of the base material is subjected to a pre-treatment with $NH_3$ gas prior to the supply of the cobalt alkylamidinate and the reducing gas with optional $H_2$ gas to the surface.

10. The method for forming a Co film as set forth in claim 1, wherein Ar gas or $N_2$ gas is supplied to the surface of the base material simultaneously with the supply of the cobalt alkylamidinate and the reducing gas with optional $H_2$ gas.

11. A method for forming a Co film characterized in that it comprises the steps of forming a Co film on the surface of a base material, which consists of an $SiO_2$ film or a barrier film serving as a primary layer, by supplying cobalt alkylamidinate and a mixture of $H_2$ and $NH_3$ and then forming a Co film at a film-forming temperature ranging from 180 to 400° C. according to a CVD technique.

12. The method for forming a Co film as set forth in claim 11, wherein a film-forming pressure during the step for forming the Co film falls within the range of from 50 to 1,000 Pa.

13. The method for forming a Co film as set forth in claim 11, wherein the ratio of the $H_2$ gas to $NH_3$ gas to be supplied falls within the following range: $40\% \leq H_2/(H_2+NH_3) \leq 80\%$, as expressed in terms of the ratio between the flow rates thereof.

14. The method for forming a Co film as set forth in claim 11, wherein a temperature of the cobalt alkylamidinate when it is supplied to the surface of the base material falls within the range of from 65 to 80° C.

15. The method for forming a Co film as set forth in claim 11, wherein the surface of the base material is subjected to a pre-treatment with $NH_3$ gas prior to the supply, to the surface, of the cobalt alkylamidinate and the $H_2$ and $NH_3$ gases.

16. The method for forming a Co film as set forth in claim 11, wherein Ar gas or $N_2$ gas is supplied to the surface of the base material simultaneously with the supply of the cobalt alkylamidinate and the $H_2$ and $NH_3$ gases.

17. The method for forming a Co film as set forth in claim 11, wherein the barrier film is one consisting of a member selected from the group consisting of Ti, TiN, Ta, TaN, W, or WN, or a silicide selected from the group consisting of $CoSi_2$, $TiSi_2$, WSi.

18. The method for forming a Co film as set forth in claim 11, wherein the cobalt alkylamidinate is $Co(tBu\text{-}Et\text{-}Et\text{-}amd)_2$.

19. A method for forming a Cu interconnection film characterized in that it comprises the steps of forming a barrier film consisting of a member selected from the group consisting of Ti, TiN, Ta, TaN, W, WN, and silicide or an $SiO_2$ film on a surface of a substrate provided thereon with holes or trenches; then forming a Co film, on the barrier film or the $SiO_2$ film, by supplying cobalt alkylamidinate with at least one gas selected from the group consisting of $NH_3$, $N_2H_4$, $NH(CH_3)_2$, $N_2H_3CH$, and $N_2$ as a reducing gas, and optionally with $H_2$ gas, on the surface of the substrate provided thereon with the barrier film or the $SiO_2$ film to thus fill up the interior of the holes or trenches formed on the substrate, whose surface has been covered with the Co film, with a Cu film; and thereafter subjecting the resulting assembly to a heat treatment at a temperature of not more than 350° C. to thus form a Cu interconnection film.

20. The method for forming a Cu interconnection film as set forth in claim 19, wherein the step of forming the Co film is carried out according to a CVD technique at a film-forming temperature ranging from 180 to 400° C., while supplying, onto the surface of the substrate, a cobalt alkylamidinate and a mixture of $H_2$ and $NH_3$ gases.

21. The method for forming a Cu interconnection film as set forth in claim 20, wherein a ratio of the $H_2$ gas to the $NH_3$ gas to be supplied falls within the following range: $40\% \leq H_2/(H_2+NH_3) \leq 80\%$, as expressed in terms of the ratio between the flow rates thereof.

22. The method for forming a Cu interconnection film as set forth in claim 19, wherein a film-forming pressure during the step of the formation of the Co film is set at a level ranging from 50 to 1,000 Pa.

23. The method for forming a Cu interconnection film as set forth in claim 19, wherein a temperature of the cobalt alkylamidinate when it is supplied to the surface of the substrate falls within the range of from 65 to 80° C.

24. The method for forming a Cu interconnection film as set forth in claim 19, wherein the surface of the substrate is subjected to a pre-treatment with $NH_3$ gas, prior to the supply of the cobalt alkylamidinate and the reducing gas with optional $H_2$ gas to the surface.

25. The method for forming a Cu interconnection film as set forth in claim 19, wherein Ar gas or $N_2$ gas is supplied to the surface of the substrate simultaneously with the supply of the cobalt alkylamidinate and the reducing gas with optional H$_2$ gas.

26. The method for forming a Cu interconnection film as set forth in claim 19, wherein the step of the heat treatment is carried out at a temperature ranging from 250 to 350° C.

27. A method for forming a Cu interconnection film characterized in that it comprises the steps of forming a barrier film consisting of a member selected from the group consisting of Ti, TiN, Ta, TaN, W, WN, and silicide or an SiO$_2$ film on a surface of a substrate provided thereon with holes or trenches; then forming a Co film, on the barrier film or the SiO$_2$ film, by supplying cobalt alkylamidinate with at least one gas selected from the group consisting of NH$_3$, N$_2$H$_4$, NH(CH$_3$)$_2$, N$_2$H$_3$CH and N$_2$ as a reducing gas, and optionally with H$_2$ gas, on the surface of the substrate provided thereon with the barrier film or the SiO$_2$ film; forming a Cu film as a seed film on the Co film; subsequently filling up the interior of the holes or trenches on which the seed film has been formed, with a Cu film according to a plating technique; and then subjecting the resulting assembly to a heat treatment at a temperature of not more than 350° C. to form a Cu interconnection film.

28. The method for forming a Cu interconnection film as set forth in claim 27, wherein the step of forming the Co film is carried out according to a CVD technique at a film-forming temperature ranging from 180 to 400° C., while supplying, onto the surface of the substrate, a cobalt alkylamidinate and a mixture of H$_2$ and NH$_3$ gases.

29. The method for forming a Cu interconnection film as set forth in claim 28, wherein a ratio of the H$_2$ gas to the NH$_3$ gas to be supplied falls within the following range: 40%≤H$_2$/(H$_2$+NH$_3$)≤80%, as expressed in terms of the ratio between the flow rates thereof.

30. A method for forming a Cu interconnection film characterized in that it comprises the steps of forming a barrier film on a surface of a substrate provided thereon with holes or trenches and then exposing the barrier film to the atmosphere; forming a Co film on the barrier film by supplying cobalt alkylamidinate with at least one gas selected from the group consisting of NH$_3$, N$_2$H$_4$, NH(CH$_3$)$_2$, N$_2$H$_3$CH, and N$_2$ as a reducing gas, and optionally with H$_2$ gas, on the surface of the substrate provided thereon with the barrier film; subsequently, optionally subjecting the resulting product to the atmospheric exposure; filling up the interior of the holes or trenches, on which the Co film has been formed, with a Cu film; and then subjecting the resulting assembly to a heat treatment carried out at a temperature of not more than 350° C. to form a Cu interconnection film.

31. The method for forming a Cu interconnection film as set forth in claim 30, wherein the step of forming the Co film is carried out according to a CVD technique at a film-forming temperature ranging from 180 to 400° C., while supplying, onto the surface of the substrate, a cobalt alkylamidinate and a mixture of H$_2$ and NH$_3$ gases.

32. The method for forming a Cu interconnection film as set forth in claim 31, wherein a ratio of the H$_2$ gas to the NH$_3$ gas to be supplied falls within the following range: 40%≤H$_2$/(H$_2$+NH$_3$)≤80%, as expressed in terms of the ratio between the flow rates thereof.

33. A method for forming a Cu interconnection film characterized in that it comprises the steps of forming a barrier film on a surface of a substrate provided thereon with holes or trenches and then exposing the barrier film to the atmosphere; forming a Co film on the barrier film by supplying cobalt alkylamidinate with at least one gas selected from the group consisting of NH$_3$, N$_2$H$_4$, NH(CH$_3$)$_2$, N$_2$H$_3$CH, and N$_2$ as a reducing gas, and optionally with H$_2$ gas, on the surface of the substrate provided thereon with the barrier film; subsequently, optionally subjecting the resulting product to the atmospheric exposure; forming a CVD-Cu film or a PVD-Cu film as a seed film on the resulting Co film; thereafter filling up the interior of the holes or trenches, on which the seed film has been formed, with a Cu film according to a plating technique; and then subjecting the resulting assembly to a heat treatment carried out at a temperature of not more than 350° C. to form a Cu interconnection film.

34. The method for forming a Cu interconnection film as set forth in claim 33, wherein the step of forming the Co film is carried out according to a CVD technique at a film-forming temperature ranging from 180 to 400° C., while supplying, onto the surface of the substrate, a cobalt alkylamidinate and a mixture of H$_2$ and NH$_3$ gases.

35. The method for forming a Cu interconnection film as set forth in claim 34, wherein a ratio of the H$_2$ gas to the NH$_3$ gas to be supplied falls within the following range: 40%≤H$_2$/(H$_2$+NH$_3$)≤80%, as expressed in terms of the ratio between the flow rates thereof.

\* \* \* \* \*